(12) United States Patent
Kawamura

(10) Patent No.: US 7,064,351 B2
(45) Date of Patent: Jun. 20, 2006

(54) CIRCUIT ARRAY SUBSTRATE

(75) Inventor: Tetsuya Kawamura, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 36 days.

(21) Appl. No.: 10/911,600

(22) Filed: Aug. 5, 2004

(65) Prior Publication Data

US 2005/0042817 A1 Feb. 24, 2005

(30) Foreign Application Priority Data

Aug. 18, 2003 (JP) ............................. 2003-294584

(51) Int. Cl.
*H01L 29/15* (2006.01)
*H01L 31/036* (2006.01)
(52) U.S. Cl. ........................................ 257/72; 257/59
(58) Field of Classification Search .................... None
See application file for complete search history.

(56) References Cited

U.S. PATENT DOCUMENTS 6,781,643 B1* 8/2004 Watanabe et al. ............. 349/38
2002/0142554 A1* 10/2002 Nakajima ..................... 438/301

FOREIGN PATENT DOCUMENTS

JP 2000-187248 7/2000

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

Poly-silicon semiconductor layer 21 and dummy poly-silicon semiconductor layer 25 are formed in insulation from each other on glass substrate. Gate insulation film 31 is formed on poly-silicon semiconductor layer 21, dummy poly-silicon semiconductor layer 25 and glass substrate and covered with scanning and gate lines 11, which is over-lapped with poly-silicon semiconductor layer 21 and dummy poly-silicon semiconductor layer 25. Poly-silicon semiconductor layer 21 is coupled with a reference potential to define capacitor Cc and also with scanning and gate line 11 to define capacitor Cd. Likewise, dummy poly-silicon semiconductor layer 25 is coupled with a reference potential to define capacitor Cc and also with scanning and gate line 11 to define capacitor Cd. Capacitors Cc and Cd suppress increase in voltage applied to gate insulation film 31 between scanning and gate line 11 and poly-silicon semiconductor layer 21 due to electrostatic charges.

7 Claims, 4 Drawing Sheets

CIRCUIT ARRAY SUBSTRATE

FIELD OF THE INVENTION

This invention relates to a circuit array substrate and a flat panel display device containing the same and, more particularly, to a thin-film transistor circuit array substrate and a flat panel display device containing the same.

This application is based upon and claims the benefit of priority from the prior Japanese Patent Application No. 2003-294584, filed on Aug. 18, 2003, the entire contents of which are incorporated in this application by reference.

DISCUSSION OF THE BACKGROUND

A flat panel display device, such as a liquid crystal display device, includes a thin-film-transistor circuit array substrate. Such a thin-film-transistor circuit array substrate is provided with an insulation substrate and pixels formed on the insulation substrate in a matrix. Each pixel contains an arrangement for a pixel electrode, a capacitor and a thin-film-transistor.

The thin-film transistor is made of an island-like poly-silicon film formed on the substrate. The thin-film transistor and the island-like poly-silicon film are coated with a gate insulation film on which, in turn, a gate electrode and a scanning line are deposited. Further, an auxiliary capacitor line is formed on the gate insulation film as a common capacitor line but is separated from the scanning line.

The scanning and auxiliary capacitor lines are covered with an interlayer insulation film. Signal lines are formed on the interlayer insulation film through which contact holes are made to electrically connect the poly-silicon film to the signal lines The liquid crystal display device further includes a counter substrate containing a color filter insulation layer. The counter substrate is provided opposite to the circuit array substrate. Liquid crystal is put into a gap defined between the circuit array and counter substrates. The gap is then sealed at its circumferences. Such a prior art liquid crystal display device as set forth above is disclosed in Japanese Unexamined Publication No. 2000-187248, its pages 4–6 and FIGS. 1–3.

The prior art liquid crystal display device requires a tremendous number of pixels to display a big volume of data. Particularly, in the case that the liquid crystal display device used for an R, G and B color display PC, its circuit array substrate is necessarily provided with a several millions of pixels.

Recently, a liquid crystal display device has had highly advanced display criteria of which point defects due to incomplete pixels are require to be as few as possible. It is extremely difficult to manufacture a liquid crystal display device with no point defects at a sufficient yield rate. Thus, it is important to provide a liquid crystal display device with a structure of less point defects or a method of manufacturing the same.

One of the prime causes for a point defect pixel is the occurrence of electrostatic-field breakdowns or destruction in manufacturing a circuit array substrate used for a liquid crystal display device. When a patterned poly-silicon film used for thin-film transistors, scanning lines and auxiliary capacitor lines are formed on an insulation substrate, a gate insulation film is provided between the poly-silicon film and the scanning lines.

Subsequently, a plasma chemical vapor deposition (plasma CVD) method is applied by a plasma CVD machine to deposit and form an interlayer insulation film on the scanning lines and the gate insulation film. During the period of depositing the interlayer insulation film or transferring it to somewhere else, electrostatic fields are generated which destroy thin-film transistors.

SUMMARY OF THE INVENTION

Accordingly, the present invention provides a circuit array substrate and a flat panel display device containing the same with suppression of point defects due to electrostatic field breakdowns while their yield rates can be improved.

The first aspect of the present invention is directed to a circuit array substrate provided with an optically transparent substrate, a thin-film transistor formed on the transparent substrate having a first semiconductor layer, a gate insulation film and a gate line, and a second semiconductor layer formed on the transparent substrate, wherein the gate line is overlapped with the first and second semiconductor layers through the gate insulation film.

The second aspect of the present invention is directed to the circuit array substrate set forth in the first aspect of the present invention, wherein let capacitors be $C_a$ defined between the first semiconductor layer and a reference potential through the transparent substrate, $C_b$ defined between the first semiconductor layer and the gate line through the gate insulation film, $C_c$ defined between the second semiconductor layer and the reference potential and $C_d$ defined between the second semiconductor layer and the gate line, and the capacitors satisfy the equation: $C_a/(C_a+C_b) < C_c/(C_c+C_d)$

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Figure 1:
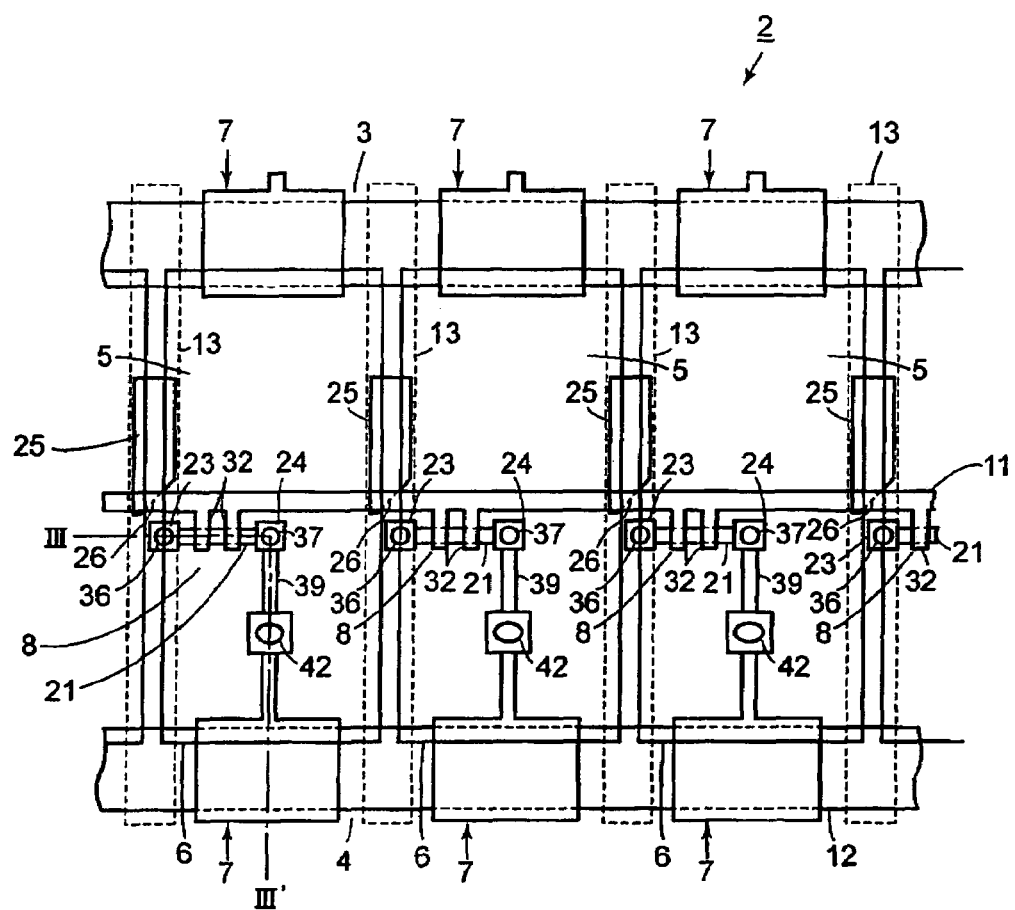
FIG. 1 is a plan view of a flat panel display device in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components.

First Embodiment

A flat panel display device in accordance with the first embodiment of the present invention will be explained with reference to FIGS. 1–4.

Figure 3:
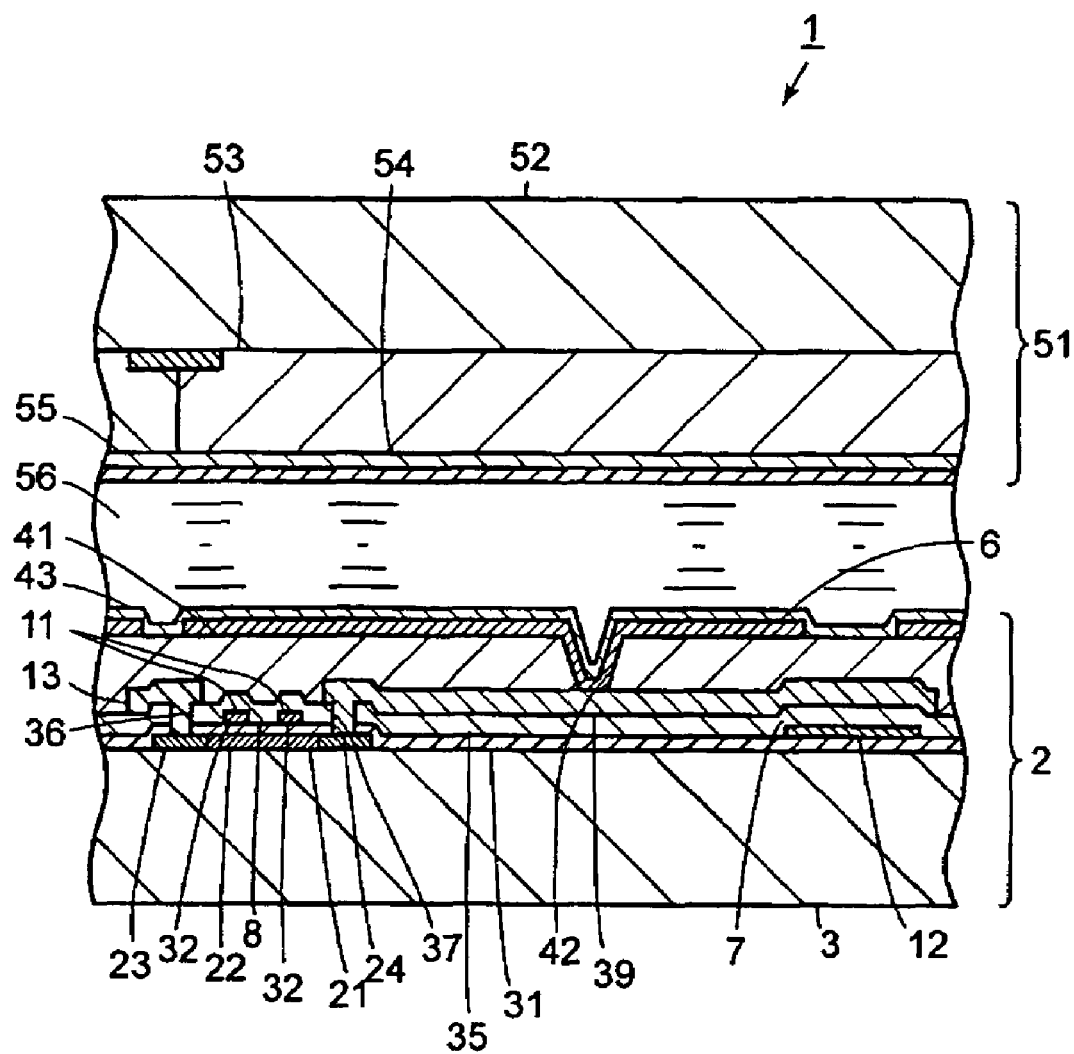
FIG. 3 is a cross-sectional view of the flat panel display device cut along line III–III' shown in FIG. 1.

A flat panel display device, such as active-matrix type liquid-crystal display device 1, includes top-gate type thin-film transistors and circuit array substrate 2 as shown in FIG. 3. Circuit array substrate 2 has an approximately rectangular and transparent-insulation substrate 3, such as #1737 glass substrate manufactured by Corning Incorporated.

Figure 4:
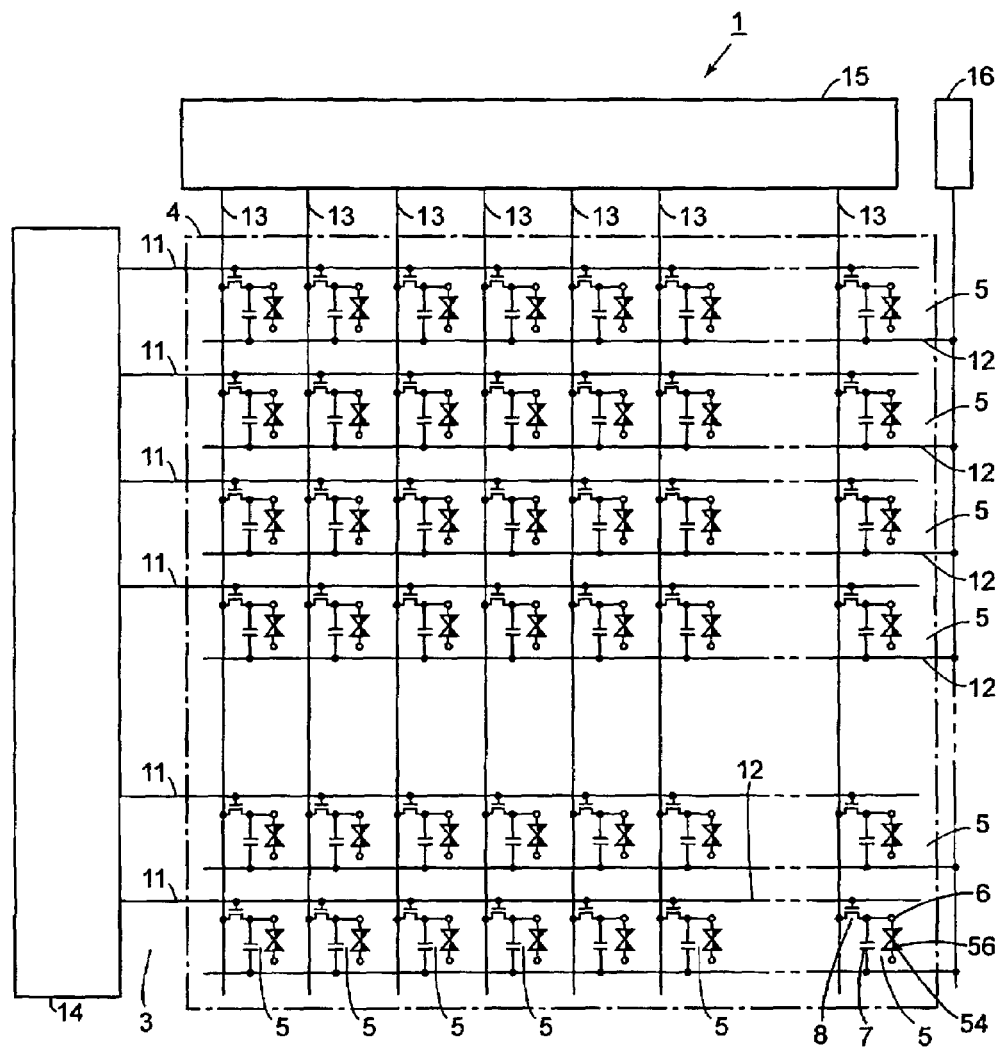
FIG. 4 is a schematic circuit arrangement of the flat panel display device shown in FIG. 1.

A major region of glass substrate 3 forms display portion 4 as shown in FIG. 4 where dot-like display pixels are arranged in a matrix. Each pixel 5 is provided with pixel electrode 6, capacitor 7 and thin-film transistor 8.

Scanning and gate lines 11 are horizontally disposed at vertically regular intervals on glass substrate 3. Scanning and gate lines 11 are made of a molybdenum (Mo) alloy and electrically connected to thin-film transistors 8.

Further, auxiliary or common capacitor lines 12 are provided between, and in parallel with, scanning and gate lines 11. Auxiliary capacitor lines 12 are electrically connected to capacitors 7 and thin-film transistors 8.

Video signal lines 13 are disposed vertically at horizontally regular intervals on glass substrate 3. Video signal lines 13 are made of a stacked layer of aluminum (Al) and high-melting point metal.

As shown in FIG. 4, Y-axis driver circuit (gate driver circuit) 14 is vertically provided at an edge portion of glass substrate 3. Y-axis driver circuit 14 is electrically connected to scanning and gate lines 11.

Likewise, X-axis driver circuit (video signal driver circuit) 15 is horizontally provided at an edge portion of glass substrate 3. X-axis driver circuit 15 is electrically connected to video signal lines 13.

Auxiliary capacitor lines 12 are commonly connected to driver circuit 16.

Meanwhile, glass substrate 3 is coated with an undercoat layer not shown but made of silicon nitride or silicon oxide. Thin-film transistors 8 are provided on the undercoat layer for pixel-switching transistors (see FIGS. 1 and 3). Thin-film transistors 8 contain the first poly-crystalline semiconductor layers, such as a poly-silicon semiconductor layers 21, formed on the undercoat layer.

Poly-silicon semiconductor layers 21 are poly-silicon films made by excimer-laser annealing to melt and re-crystallize amorphous silicon films. Each poly-silicon semiconductor layer 21 is provided with channel region 22 and source and drain regions 23 and 24 on both sides of channel region 22.

Further, the second poly-crystalline semiconductor layers, such as poly-silicon semiconductor layers 25, are formed on the undercoat layer but apart from poly-silicon semiconductor layers 21. Poly-silicon semiconductor layers 25 are used not for thin-film transistors 8 but for dummy semiconductor layers. Dummy poly-silicon semiconductor layers 25 are made of the same poly-silicon films and by the same processes as poly-silicon semiconductor layers 21.

Each dummy poly-silicon semiconductor layer 25 is provided for every pixel 5 on circuit array substrate 2 but electrically insulated from each poly-silicon semiconductor layer 21. Further, as shown in FIG. 1, dummy poly-silicon semiconductor layer 25 is smaller in width than video signal line 13 and disposed under, and along, video signal line 13.

In short, dummy poly-silicon semiconductor layer 25 is covered with video signal line 13.

In addition, dummy poly-silicon semiconductor layer 25 has a tapered-off portion 26 at its edge portion which faces poly-silicon semiconductor 21 of thin-film transistor 8 and a cross-point portion of scanning and gate lines 11 and video signal line 13. The edge portion is also overlapped with scanning and gate lines 11 and video signal line 13.

As shown in FIG. 3, gate insulation film 31 is formed on channel region 22, source and drain regions 23 and 24, and the undercoat layer. Gate insulation film 31 is made of 150 nm thick silicon oxide by applying a plasma CVD method to poly-silicon semiconductor layer 21 and the undercoat layer.

A pair of narrow rectangular gate electrodes 32 are provided opposite to channel region 22 of thin-film transistor 8 on gate insulation film 31. Gate electrodes 32 are apart from each other along the longitudinal direction of channel region 22. As shown in FIG. 1, gate electrodes 32 are formed in integration with, and electrically connected to, scanning and gate line 11. That is, gate electrodes 32 are narrow strips projected from scanning and gate line 11.

Further, scanning and gate line 11 formed on gate insulation film 31 is overlapped with a part of tapered-off portion 26 of dummy poly-silicon semiconductor layer 25 and, by means of gate electrodes 32, poly-silicon semiconductor layer 21. Thus, scanning and gate line 11 extends in the width direction of dummy poly-silicon semiconductor layer 25 and crosses over, and is overlapped with, the edge portion of tapered-off portion 26 of dummy poly-silicon semiconductor layer 25. Scanning and gate line 11 is provided on gate insulation film 31.

Figure 2:
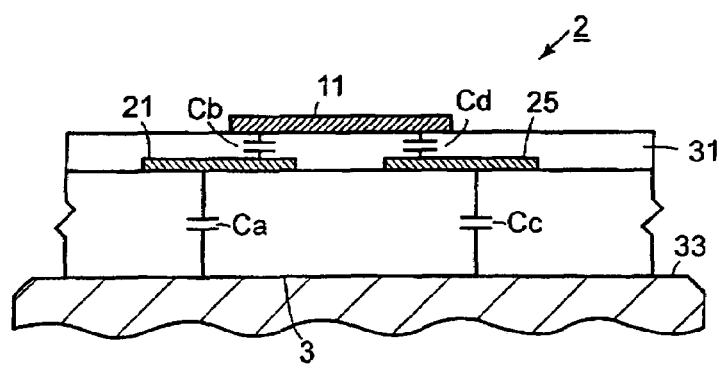
FIG. 2 is a schematic cross-sectional view of the flat panel display device shown in FIG. 1 which is placed on an electrically conductive table.

As shown in FIG. 2, poly-silicon semiconductor layers 21 and 25 on glass substrate 3 of circuit array substrate 2 is placed on electrically conductive table 33 which is grounded at a reference potential. Capacitor Ca is defined between poly-silicon semiconductor layer 21 and table 33 while capacitor Cb is defined between poly-silicon semiconductor layer 21 and scanning and gate line 11. Further, capacitor Cc is defined between dummy poly-silicon semiconductor layer 25 and table 33 while capacitor Cd is defined between dummy poly-silicon semiconductor layer 25 and scanning and gate line 11. Dummy poly-silicon semiconductor layer 25 is set to satisfy the following equation: $Ca/(Ca+Cb)<Cc/(Cc+Cd)$.

In addition, capacitors 7 are provided for pixel auxiliary capacitors on gate insulation film 31 which are apart from gate electrodes 32. Capacitors 7 are provided with common capacitor lines 12 formed on gate insulation film 31. Capacitors 7 are electrically insulated from gate electrodes 32 of thin-film transistors 8 and cross scanning and gate lines 11. Capacitors 7 are, however, made in the same process, and of the same materials, as scanning and gate lines 11.

Interlayer insulation film 35 is then formed on common capacitor lines 12, gate electrodes 32 and gate insulation film 31. Interlayer insulation film 35 is a stacked layer of 350 nm silicon nitride and 450 nm silicon oxide formed by applying a plasma CVD method. Subsequently, contact holes 36 and 37 are made through interlayer insulation film 35 and gate insulation film 31.

Contact holes 36 and 37 are located on both sides of gate electrodes 32 of thin-film transistors 8 at portions corresponding to source and drain regions 23 and 24 of thin-film transistors 8. Contact hole 36 is communicated to source regions 23 of thin-film transistors 8 while contact hole 37 is communicated to drain regions 24 of thin-film transistors 8.

Video signal lines 13, parts of which function as source electrodes of thin-film transistors 8, are formed on interlayer insulation film 35 and electrically connected to source regions 23 of thin-film transistors 8 through contact holes 36.

Drain electrodes 39, parts of which function as signal lines, are formed on interlayer insulation film 35 including contact holes 37 connected to drain regions 24 of thin-film transistors 8. Drain electrodes 39 are provided opposite to common capacitor lines 12 of capacitors 7 to define auxiliary capacitors together with common capacitor lines 12. Drain electrodes 39 are electrically connected to drain regions 24 of thin-film transistors 8 through contact holes 36. Further, drain electrodes 39 are made in the same process, and of the same materials, as video signal lines 13.

Thus, thin-film transistors 8 are composed of video signal lines 13, drain electrodes 39, ply-silicon semiconductor layer 21, scanning and gate lines 11, gate insulation film 31 and interlayer insulation film 35.

Leveling and protective film 41 is formed on video signal lines 13, drain electrodes 39 of thin-film transistors 8 and interlayer insulation film 35. Contact holes 42 are made through protective film 41 to reach drain electrodes 39 of thin-film transistors 8.

Pixel electrodes 6 made of an indium-tin-oxide (ITO) film are filled in contact holes 42 and also formed on protective film 41. Pixel electrodes 6 are electrically connected to drain electrodes 39 of thin-film transistors 8 through contact holes 42. Pixel electrodes 6 are controlled by thin-film transistors 8. Alignment film 43 is coated on pixel electrodes 6 and protective film 41.

Further, rectangular plate-like counter substrate 51 is provided opposite to circuit array substrate 2. Counter substrate 51 is provided with an optically transparent and rectangular plate-like insulation substrate, such as glass substrate 52. Color filter layer 53 with red, green and blue filters is provided under glass substrate 52 of counter substrate 51. The color filter of color filter layer 53 is disposed on each pixel 5 corresponding to dummy poly-silicon semiconductor layer 25.

Color filter layer 53 is covered with rectangular plate-like counter electrode 54 which entirely faces display portion 4 on glass substrate 3 of circuit array substrate 2 when counter substrate 51 is provided opposite to circuit array substrate 2. Alignment film 55 is coated on counter electrode 54.

Counter substrate 51 is provided opposite to circuit array substrate 2 so that counter electrode 54 of counter substrate 51 faces pixel electrodes 6 of circuit array substrate 2. Liquid crystal layer 56 is held between counter substrate 51 and circuit array substrate 2 as a light modulator and is confined in liquid crystal display device 1 by a sealant.

Next, a method of manufacturing the circuit array substrate described above will be explained below.

The undercoat layer is formed on glass substrate 3 and an amorphous silicon film is then deposited on glass substrate 3 by applying a plasma CVD method.

Excimer laser beams are irradiated to anneal the amorphous silicon film so that the amorphous silicon film is melted and re-crystallized into a poly-silicon film.

An impurity is then doped into the poly-silicon film. A photo-lithography is applied to the doped poly-silicon film to make an island-like pattern of poly-silicon semiconductor layer 21 and dummy poly-silicon semiconductor layer 25 in the same process and with the same materials.

A plasma CVD method is applied to deposit gate insulation film 31 of a 150 nm thick silicon oxide film on the undercoat, and the island-like pattern of poly-silicon semiconductor layer 21 and dummy poly-silicon semiconductor layer 25.

Next, an electrically conductive layer not shown but made of molybdenum (Mo) alloy is formed on gate insulation film 31. The conductive layer is etched to form gate electrodes 32 of thin-film transistors 8, scanning and gate lines 11 and common capacitor lines 12.

N-type or P-type impurity is then doped into source and drain regions 23 and 24 of thin-film transistors 8 through gate electrodes 32 as a mask pattern.

Subsequently, a plasma CVD method is carried out to deposit interlayer insulation film 35 stacked with a 350 nm silicon nitride film and a 450 nm silicon oxide film on scanning and gate lines 11, common capacitor lines 12 and gate insulation film 31.

A photo-lithography method is then applied to make contact holes 36 and 37 through interlayer insulation film 35 reaching source and drain regions 23 and 24 of thin-film transistors 8, respectively.

A stacked layer of aluminum (Al) and high-melting point metal (such a stacked structure is not shown) is formed on interlayer insulation film 35 and filled in contact holes 36 and 37 as an electrically conductive layer. An etching process by a photo-lithography method is performed for the conductive layer to form video signal lines 13, source electrodes, and drain electrodes 39.

Further, interlayer insulation film 35, video signal lines 13 and drain electrodes 39 are entirely covered with flat protective film 41.

Next, an etching process by a photo-lithography method is again applied to protective film 41 to make contact holes 42 reaching drain electrodes 39.

The ITO film is then sputtered to contact holes 42 and protective film 41 for pixel electrodes 6. An etching process by a photo-lithography method is further applied to pattern pixel electrodes 6.

Alignment film 43 is coated on pixel electrodes 6 and protective film 41 to complete circuit array substrate 2. By applying substantially the same manufacturing processes as thin-film transistors, Y-axis and X-axis driver circuits 14 and 15 and driver circuit 16 are formed at circumference locations of display portion 4 on glass substrate 3 of circuit array substrate 2.

Subsequently, circuit array substrate 2 is assembled with counter substrate 51 to dispose alignment film 43 of circuit array substrate 2 opposite to alignment film 55 of counter substrate 51. Liquid crystal layer 56 is then formed between circuit array substrate 2 and counter substrate 51. Circuit array substrate 2 and counter substrate 51 are sealed at their circumference by a sealant.

Further, other components, such as a rear light source, polarizers and system circuits, are assembled with circuit array substrate 2 and counter substrate 51 to complete liquid crystal display device 1.

As described above, the electrostatic charges accumulated between gate electrodes 32 and poly-silicon semiconductor layer 21 of thin-film transistors 8 possibly cause electrostatic breakdowns in the application of a plasma method, such as the plasma CVD or sputtering process, after the formation of scanning and gate lines 11. The electrostatic charges are also accumulated between scanning and gate lines 11 and table 33. That is, capacitors Ca are formed between poly-silicon semiconductor layers 21 of thin-film transistors 8 and table 33 and capacitors Cb are also formed between poly-silicon semiconductor layers 21 of thin-film transistors 8 and scanning and gate lines 11 as shown in the equivalent circuit of FIG. 2.

Where it is desirable to simply increase the capacitance of capacitors Ca and Cb coupled with table 33 and scanning and gate lines 11, respectively, the area of scanning and gate lines 11 may be increased. It causes an increased electrostatic charge quantity itself but does not have any effect to suppress the electrostatic breakdowns.

According to the first embodiment of the present invention, dummy poly-silicon semiconductor layer 25 is provided on the undercoat layer of circuit array substrate 2, is insulated from poly-silicon semiconductor layer 21, faces the cross-point of scanning and gate lines 11 with video signal lines 13 and is overlapped with scanning and gate lines 11 and video signal lines 13.

As a result, dummy poly-silicon semiconductor layer 25 increases the electric capacitance of capacitors Cc and Cd coupled to table 33 and scanning and gate lines 11, respectively. Where the electrostatic charge accumulated in gate electrodes 32 is the same in quantity as a prior art liquid crystal display device without dummy poly-silicon semiconductor layer 25 and due to gate voltage being V=Q/C, (i.e., gate voltage V and accumulated charges Q at its equivalent capacitor C) an increase in voltage at gate electrodes 32 due to the electrostatic charges can be effectively suppressed.

Thus, it can avoid the possible electrostatic breakdowns at gate insulation film 31 caused in the plasma CVD or sputtering process after the formation of scanning and gate lines 11. Further, it can also reduce damages of thin-film transistors, i.e., the occurrence of point defects at pixels 5 of circuit array substrate 2 caused by electrostatic charges in the manufacturing process of interlayer insulation film 35 after the formation of scanning and gate lines 11. Therefore, the production yield of liquid crystal display device 1 with circuit array substrate 2 is significantly improved.

With circuit array substrate 2 placed on table 33, let capacitors be Ca defined between poly-silicon semiconductor layer 21 and table 33, Cb defined between poly-silicon semiconductor layer 21 and scanning and gate line 11, Cc defined between dummy poly-silicon semiconductor layer 25 and table 33 and Cd defined between dummy poly-silicon semiconductor layer 25 and scanning and gate line 11. In addition, the area of dummy poly-silicon semiconductor layer 25 and the same overlapped with scanning and gate lines 11 are determined to satisfy the equation: Ca/(Ca+Cb)<Cc/(Cc+Cd).

As a result, a voltage applied to a portion of gate insulation film 31 between dummy poly-silicon semiconductor layer 25 and scanning and gate line 11 is larger than that supplied to a portion of gate insulation film 31 between poly-silicon semiconductor layer 21 of thin-film transistor 8 and scanning and gate line 11. Thus, even if electrostatic charges for electrostatic breakdowns are accumulated at gate insulation film 31, the electrostatic charges will be discharged through the portion of gate insulation film 31 between dummy poly-silicon semiconductor layer 25 and scanning and gate line 11 to break down the portion of gate insulation film 31 between dummy poly-silicon semiconductor layer 25 and scanning and gate line 11 earlier than that of gate insulation film 31 between poly-silicon semiconductor layer 21 of thin-film transistor 8 and scanning and gate line 11. As a result, poly-silicon semiconductor layers 21 of thin-film transistors 8 necessary for liquid crystal display device 1 are protected at an extremely high probability.

Further, poly-silicon semiconductor layers 21 of thin-film transistors 8 and dummy poly-silicon semiconductor layers 25 are formed in the same process and made of the same materials. Thus, since it does not increase the number of manufacturing processes, dummy poly-silicon semiconductor layers 25 can be manufactured efficiently at a low cost. At the same time, the productivity of circuit array substrate 2 with dummy poly-silicon semiconductor layers 25 can be substantially increased.

Additionally, dummy poly-silicon semiconductor layers 25 are covered with video signal lines 13 to be formed thereafter. As a result, a part of pixel electrodes 6 is not covered with dummy poly-silicon semiconductor layers 25. Thus, dummy poly-silicon semiconductor layers 25 do not affect optical efficiency of pixel electrodes 6. In other words, the provision of dummy poly-silicon semiconductor layers 25 is simple in structure but does not deteriorate aperture ratios of pixels 5 of circuit array substrate 2.

Second Embodiment

Figure 5:
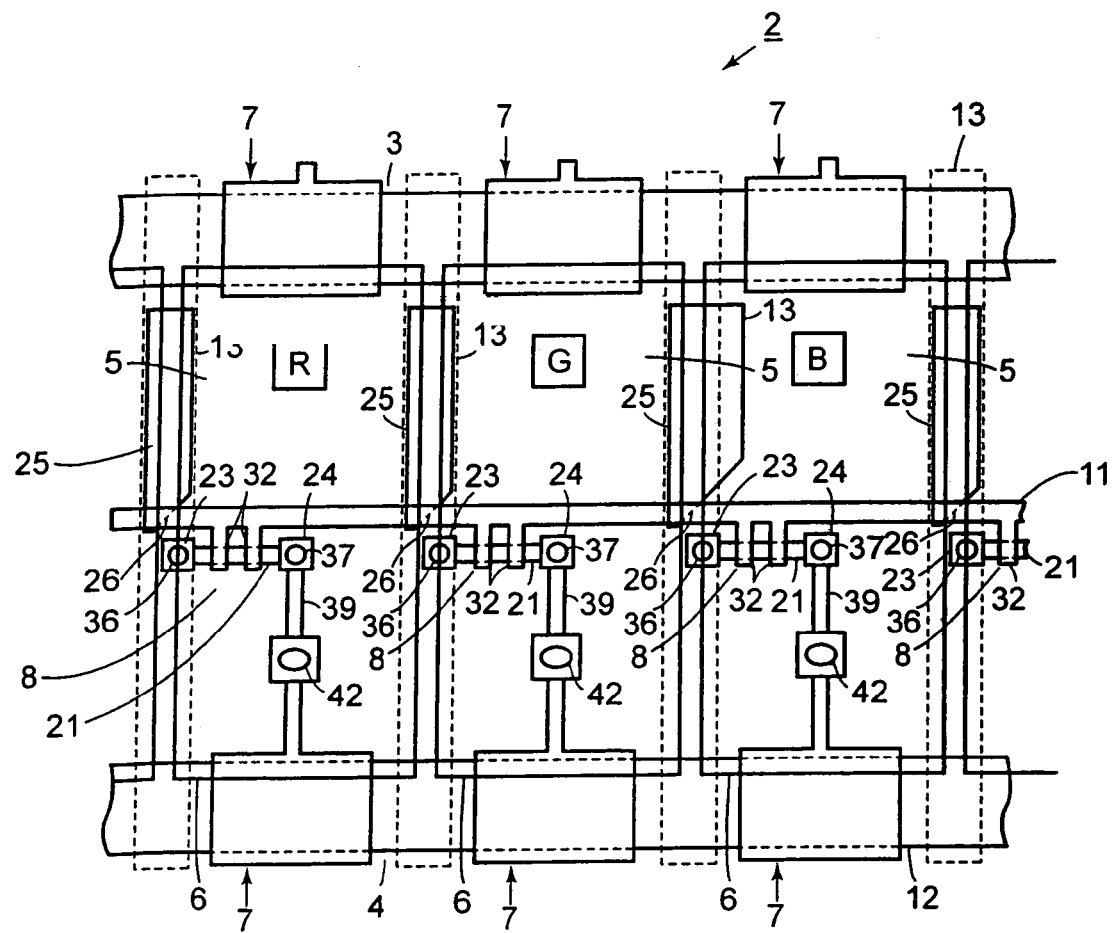
FIG. 5 is a plan view of a flat panel display device in accordance with the second embodiment of the present invention.

Dummy poly-silicon semiconductor layers 25 in the first embodiment are covered with video signal lines 13 but, as shown in the second embodiment of the present invention in FIG. 5, some dummy poly-silicon semiconductor layers 25 can be provided to extend from video signal lines 13. It results in increase in area of those dummy poly-silicon semiconductor layers 25 so that capacitors defined between dummy poly-silicon semiconductor layers 25 and table 33 can be bigger. Thus, it substantially reduces point defects at pixels 5 of circuit array substrate 2 possibly caused by electrostatic charges in the process after the formation of scanning and gate lines 11 so that the production yield of liquid crystal display device 1 with circuit array substrate 2 can be improved.

Dummy poly-silicon semiconductor layers 25 are not necessarily the same in shape among pixels 5 for red, green and blue colors of circuit array substrate 2. As shown in FIG. 5, it can be optimized by extending dummy poly-silicon semiconductor layers 25 for blue color pixels only from video signal lines 13.

The present invention is not limited to the embodiments described above. The present invention is applicable not only to a liquid crystal display device as described so far but also other flat panel display devices, such as an organic electro-luminescence display device in which a liquid crystal layer is replaced by an electro-luminescence material layer.

Further, Y-axis and X-axis driver circuits 14 and 15 and driver circuit 16 can be manufactured separately from circuit array substrate 2 but assembled with circuit array substrate 2 afterward.

Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed. Some components of the embodiments may be eliminated or various components from different embodiments may also be combined.

What is claimed is:

1. A circuit array substrate, comprising:
   an optically transparent substrate;
   a thin-film transistor formed on said transparent substrate having a first semiconductor layer, a gate insulation film and a gate line; and
   a second semiconductor layer formed on said transparent substrate,
   wherein said gate line is overlapped with said first and second semiconductor layers through said gate insulation film, and
   an equation Ca/(Ca+Cb)<Cc/(Cc+Cd) is satisfied,
   where Ca is a capacitor defined between said first semiconductor layer and a reference potential through said transparent substrate, Cb is a capacitor defined between said first semiconductor layer and said gate line through said gate insulation film, Cc is a capacitor defined between said second semiconductor layer and said reference potential through said transparent substrate, and Cd is a capacitor defined between said second semiconductor layer and said gate line.

2. A circuit array substrate according to claim 1, wherein said first semiconductor layer is made in a process, and said second semiconductor layer is made in the same process as said first semiconductor layer.

3. A circuit array substrate according to claim 2, wherein said gate insulation film is formed on said transparent substrate, and said gate line is formed on said gate insulation film.

4. A circuit array substrate according to claim 3, further comprising a first insulation film covering said gate line and said gate insulation film, wherein said first insulation film is made by applying a plasma chemical vapor deposition, said transparent substrate is a glass substrate, and said first and second semiconductor layers are polysilicon semiconductor layers.

5. A circuit array substrate according to claim 4, further comprising a video signal line formed on said second semiconductor layer through said first insulation film.

6. A circuit array substrate according to claim 5, further comprising a protective film formed on said video signal line and said first insulation film, and a color layer formed on said protective film;

wherein said second semiconductor layer is provided for said color layer.

7. A flat panel display device having a circuit array substrate according to one of claims 1 through 6, further comprising an optical modulator formed on a main plane of said circuit array substrate.

* * * * *